(12) United States Patent
Chon et al.

(10) Patent No.: US 11,336,248 B2
(45) Date of Patent: May 17, 2022

(54) METHOD FOR GENERATING AUDIO LOUDNESS METADATA AND DEVICE THEREFOR

(71) Applicant: GAUDIO LAB, INC., Seoul (KR)

(72) Inventors: Sangbae Chon, Seoul (KR); Jiwon Oh, Seoul (KR); Hyunoh Oh, Gyeonggi-do (KR); Jeonghun Seo, Seoul (KR); Taegyu Lee, Seoul (KR)

(73) Assignee: GAUDIO LAB, INC., Seoul (KR)

( * ) Notice: Subject to any disclaimer, the term of this patent is extended or adjusted under 35 U.S.C. 154(b) by 0 days.

(21) Appl. No.: 17/067,624

(22) Filed: Oct. 9, 2020

(65) Prior Publication Data

US 2021/0111686 A1   Apr. 15, 2021

(30) Foreign Application Priority Data

Oct. 10, 2019   (KR) .................. 10-2019-0125086

(51) Int. Cl.
*H03G 3/00*   (2006.01)
*H03G 7/00*   (2006.01)
*H03G 9/02*   (2006.01)

(52) U.S. Cl.
CPC .............. *H03G 7/007* (2013.01); *H03G 9/025* (2013.01)

(58) Field of Classification Search
CPC ...................................................... H03G 3/00
See application file for complete search history.

(56) References Cited

U.S. PATENT DOCUMENTS

| | | | |
|---|---|---|---|
| 7,848,531 B1 * | 12/2010 | Vickers | H03G 7/002 381/107 |
| 8,433,079 B1 | 4/2013 | Hippie et al. | |
| 2011/0222695 A1 | 9/2011 | Hess et al. | |
| 2012/0328115 A1 * | 12/2012 | Wolters | H03G 9/005 381/57 |
| 2015/0348564 A1 * | 12/2015 | Paulus | G10L 19/008 704/500 |
| 2016/0219387 A1 * | 7/2016 | Ward | H04S 7/30 |
| 2019/0043528 A1 * | 2/2019 | Humphrey | G06F 16/683 |
| 2019/0285673 A1 * | 9/2019 | Skovenborg | H03G 5/165 |
| 2020/0162048 A1 * | 5/2020 | Cremer | H03G 3/3005 |
| 2021/0201863 A1 * | 7/2021 | Bosch Vicente | G10H 1/0025 |

OTHER PUBLICATIONS

Notice of Allowance dated Jan. 26, 2022 for Korean Patent Application No. 10-2020-0128915 and its English translation provided by Applicant's foreign counsel.

* cited by examiner

*Primary Examiner* — Olisa Anwah

(74) *Attorney, Agent, or Firm* — Ladas & Parry, LLP

(57) ABSTRACT

A method of generating audio loudness performed by an audio loudness generation device may include: receiving loudness information on each of a plurality of audio tracks included in one group; predicting an intermediate loudness distribution, which is a loudness distribution for the one group, on the basis of the loudness information on each of the plurality of audio tracks; and generating an integrated loudness for the one group on the basis of the intermediate loudness distribution.

18 Claims, 7 Drawing Sheets

METHOD FOR GENERATING AUDIO LOUDNESS METADATA AND DEVICE THEREFOR

CROSS-REFERENCE TO RELATED APPLICATIONS

This application claims priority to and the benefit of Korean Patent Application No. 10-2019-0125086 filed in the Korean Intellectual Property Office on Oct. 10, 2019, the entire contents of which are incorporated herein by reference.

TECHNICAL FIELD

The present disclosure relates to a method and a device for effectively generating audio loudness metadata and, more particularly, to a method and a device for easily generating loudness information from audio in broadcasting, streaming, and the like.

BACKGROUND ART

As mainstream audio technology changes from analog technology to digital technology, it is possible to provide a wider loudness, and the loudness of content also differs depending on the case. International standards organizations such as ITU (International Telecommunication Union), EBU (European Broadcasting Union), and the like have released standards, but the standards are not being implemented well in practice because the target volume may differ in the content production process. In addition, methods and standards for measuring loudness may differ between countries, which makes it difficult to directly use corresponding loudness information.

Relying on the psychoacoustic characteristic by which perceived sound quality is improved as the volume increases, content creators provide content mixed with louder sounds to users, and a competitive phenomenon known as the "Loudness War" is taking place according thereto. Accordingly, the user has to frequently adjust the volume due to the difference in loudness between pieces of content or even within a single piece of content. Therefore, for the convenience of the end user, loudness normalization has been introduced as a solution to unify the target volume of content of which the target volume is irregular.

Accordingly, loudness normalization is being performed in various ways. In the case where a plurality of clips is made from one piece of content, the loudness between the clips may be corrected, but the context of the content in its entirety may be damaged. For example, a classical symphony composed of a total of 4 movements may be managed for the respective movements using separate clips, thereby configuring a total of 4 clips. Here, the $3^{rd}$ movement of the classical symphony may have a quiet section and the $4^{th}$ movement thereof may have a majestic section. In this case, if loudness correction is performed independently for each of the movements, the volume of the $3^{rd}$ movement is increased and the volume of the $4^{th}$ movement is decreased, thereby resulting in distortion of the artistic intent of the composer and the performers for each movement. In order to avoid the phenomenon of distorting the artistic intent, loudness normalization is required to be performed for one piece of content encompassing all of the $1^{st}$ to $4^{th}$ movements. As another example, a video of about 2 hours may include 10 clips each having a duration of 12 minutes, and the video also requires loudness normalization for the entire section thereof. This loudness normalization may be referred to as an "album mode" or a "group mode". Therefore, it is necessary to extract group integrated loudness information on a complete piece of content together with integrated loudness of individual clips. That is, when one clip is finally reproduced, metadata is required to be provided so as to reproduce the same according to the loudness appropriate for the context thereof, among the integrated loudness of the one clip and the group integrated loudness of the entire content.

DISCLOSURE

Technical Problem

An objective of the present disclosure is to provide a method of predicting the loudness of the entire content by utilizing loudness information on each of tracks constituting the content.

Technical Solution

This specification provides a method of generating audio loudness.

Specifically, a method of generating audio loudness performed by an audio loudness generation device may include: receiving loudness information on each of a plurality of audio tracks included in one group; predicting an intermediate loudness distribution, which is a loudness distribution for the one group, on the basis of the loudness information on each of the plurality of audio tracks; and generating an integrated loudness for the one group on the basis of the intermediate loudness distribution, wherein the loudness information on each of the plurality of audio tracks may include at least one of an integrated loudness, a loudness range, and a duration for each of the plurality of audio tracks.

In addition, in the specification, the method may further include performing loudness normalization for the one group on the basis of the integrated loudness for the one group.

In addition, in the specification, an audio loudness generation device for performing a method of generating audio loudness may include: an input terminal configured to receive loudness information on each of a plurality of audio tracks included in one group; and a processor, wherein the processor may be configured to predict an intermediate loudness distribution, which is a loudness distribution for the one group, on the basis of the loudness information on each of the plurality of audio tracks and generate an integrated loudness for the one group on the basis of the intermediate loudness distribution, and wherein the loudness information for each of the plurality of audio tracks may include at least one of an integrated loudness, a loudness range, and a duration for each of the plurality of audio tracks.

In addition, in the specification, the processor may be configured to perform loudness normalization for the one group on the basis of the integrated loudness for the one group.

In addition, in the specification, the intermediate loudness distribution may be predicted based on the loudness distribution for each of the plurality of audio tracks, and the loudness distribution for each of the plurality of audio tracks may be generated based on the loudness information on each of the plurality of audio tracks.

In addition, in the specification, the loudness distribution for each of the plurality of audio tracks may be a histogram.

In addition, in the specification, the intermediate loudness distribution may be a histogram.

In addition, in the specification, the duration of each of the plurality of audio tracks may be a relative duration.

In addition, in the specification, the intermediate loudness distribution may be predicted by summing all of the loudness distributions for the respective audio tracks.

In addition, in the specification, the loudness distribution for each of the plurality of audio tracks may be generated through the following equation, $$\text{dist}\_n[k] = D\_n/LRA\_n/\text{res}$$

$$\text{for } (L\_n - LRA\_n/2)/\text{res} < k < (L\_n + LRA\_n/2)/\text{res}$$

$$\text{dist}\_n[k] = 0 \qquad [\text{Equation}]$$

otherwise where, "$D\_n$" is the duration of the $n^{th}$ track among the plurality of audio tracks, "$LRA\_n$" is the loudness range of the $n^{th}$ track among the plurality of audio tracks, "$L\_n$" is the integrated loudness of the $n^{th}$ track among the plurality of audio tracks, "res" is the momentary loudness resolution of the $n^{th}$ track among the plurality of audio tracks, "$\text{dist}\_n[k]$" is the intermediate loudness distribution of the $n^{th}$ track among the plurality of audio tracks, and "k" is the loudness index according to a res interval.

In addition, in the specification, the loudness distribution for each of the plurality of audio tracks may be a loudness distribution measured in a predetermined time period.

Advantageous Effects

The present disclosure has the effect of rapidly and efficiently predicting the loudness of the entire content through loudness information on each of tracks constituting the content, thereby performing loudness normalization.

The present disclosure has the effect of reproducing the original author's intent when reproducing final content using the loudness of the entire content for loudness normalization and maintaining a change in loudness between tracks constituting the content.

DESCRIPTION OF DRAWINGS

The above and other aspects, features, and advantages of the present disclosure will be more apparent from the following detailed description taken in conjunction with the accompanying drawings, in which.

MODE FOR INVENTION

The terms used in this specification have been selected from general terms currently and widely used as possible in consideration of functions thereof in the present disclosure, but the terms may vary depending on the intention of one skilled in the art, common practices, or the emergence of new technologies. In addition, terms arbitrarily selected by the applicant will be used in specific cases, and here, the meaning thereof will be described in the description of the present disclosure corresponding thereto. Therefore, it should be noted that the terms used in this specification must be interpreted based on the actual meanings of the terms and the description throughout the specification, instead of names of the terms.

"Loudness" used in the present disclosure may be program loudness defined in the standard EBU-R 128. "Loudness" may be loudness over the entire time of the program. "Loudness range" may be a parameter indicating the distribution of loudness in one program, and a specific calculation thereof may follow the standard EBU Tech 3342. "Momentary loudness" or "short-term loudness" may be loudness over time of a program for calculating the program loudness. Specifically, momentary loudness performs time sliding of 0.4 seconds and the short-term loudness performs time sliding of 3 seconds, which may be obtained by a calculation method according to the standard EBU Tech 3341.

"Loudness normalization" may be a task of changing the amplitude of input signals having different pieces of integrated loudness for one or more programs so as to have target loudness, which is a specific value, and basically, may be implemented by compensating for the difference between the target loudness and the integrated loudness.

Measurement of Loudness for Group Track through Generation of Group Track

Figure 1:
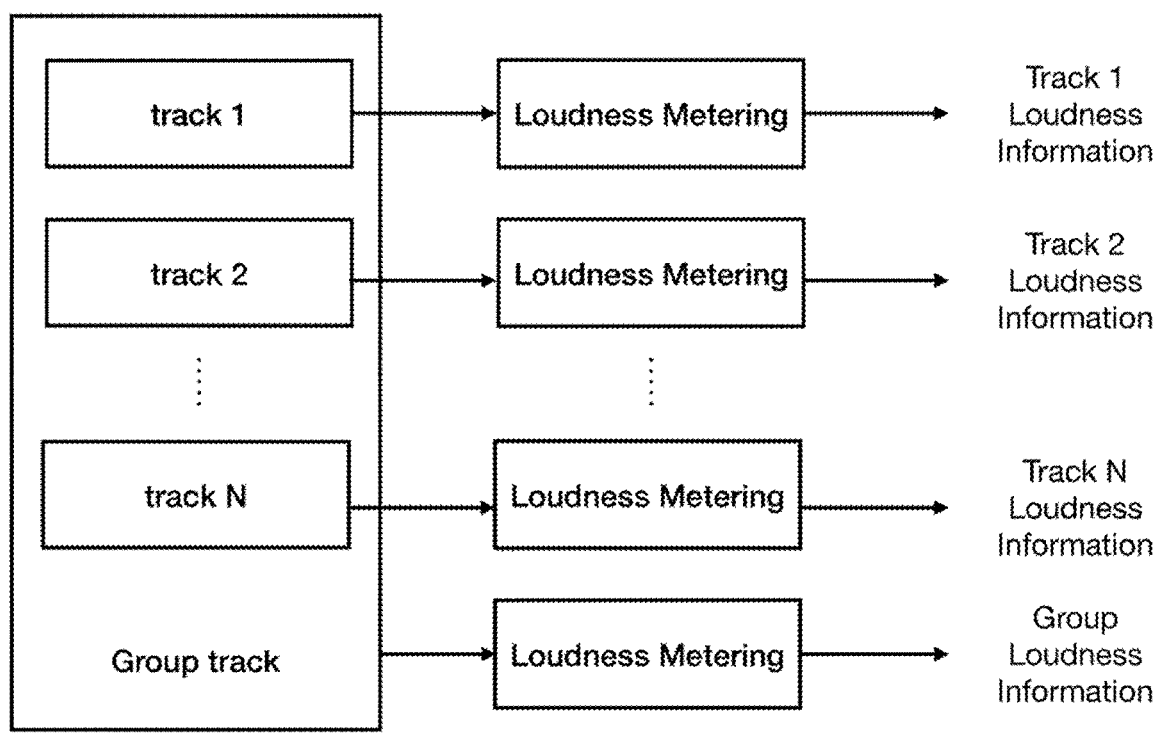
FIG. 1 is a diagram illustrating a method of measuring loudness for a group track according to an embodiment of the present disclosure.

FIG. 1 is a diagram illustrating a method of measuring loudness for a group track according to an embodiment of the present disclosure.

Referring to FIG. 1, one piece of content may include N tracks (track 1, track 2, . . . , and track N). In this case, a device for generating loudness for one piece of content (hereinafter, referred to as a "loudness generation device") may integrate sound sources s_1(n), s_2(n), . . . , and s_N(n) for N tracks into a group track. In addition, the loudness generation device may meter integrated loudness for the group track. The group track may be the same as one piece of content. One piece of content described in the specification may be content having continuity. For example, one piece of content may be a symphony including a plurality of movements. In this case, each of the plurality of movements may be one track (e.g., a sound source).

The method of metering the integrated loudness may be a method defined in a standard (ITU-R BS.1770-4, EBU R 128, EBU TECH 3341, EBU TECH 3342, or the like).

Figure 2:
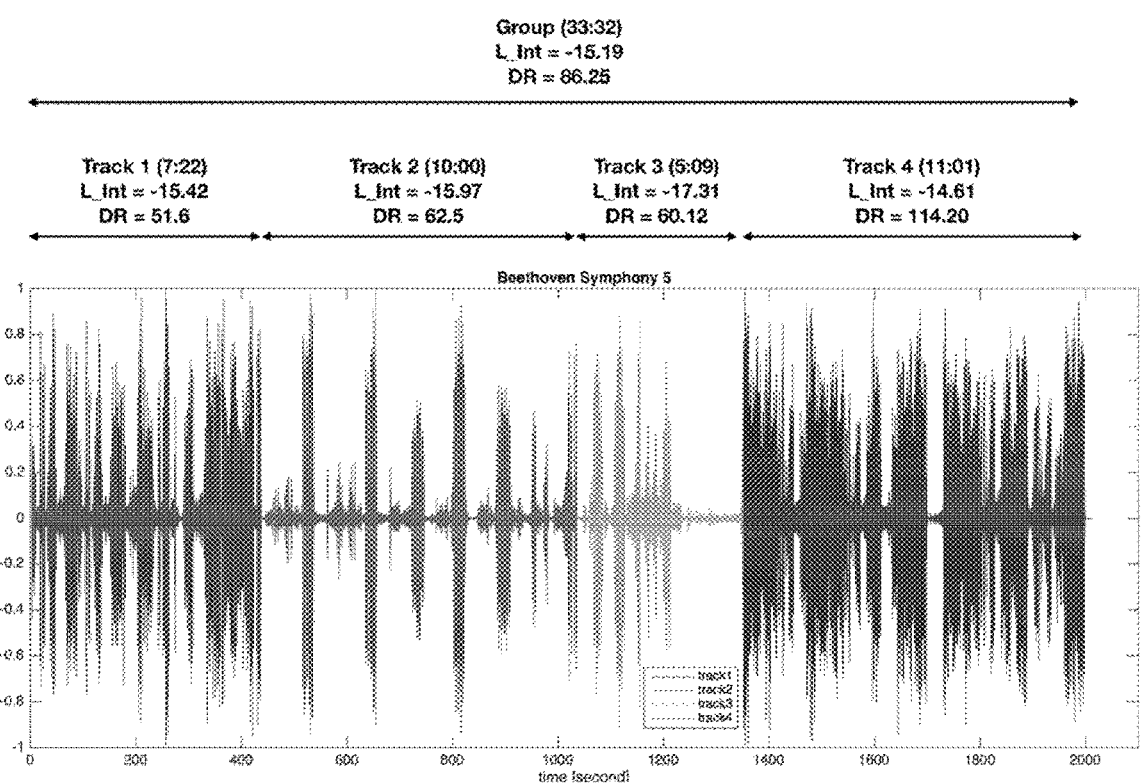
FIG. 2 is a diagram illustrating the results of measuring loudness for a group track according to an embodiment of the present disclosure.

FIG. 2 is a diagram illustrating the results of measuring loudness for a group track according to an embodiment of the present disclosure.

Referring to FIG. 2, Track 1 is a sound source having a duration of 7 minutes and 22 seconds, Track 2 is a sound source having a duration of 10 minutes, Track 3 is a sound source having a duration of 5 minutes and 9 seconds, and Track 4 is a sound source having a duration of 11 minutes and 1 second. The loudness generation device may generate a group track of 33 minutes and 32 seconds by integrating Track 1 to Track 4 into one, and may measure the integrated loudness of the generated group track of 33 minutes and 32 seconds. In this case, the result of measuring the integrated loudness of the group track is −15.19 LKFS.

However, the method of combining a plurality of tracks into a group track (e.g., one piece of content) and measuring the integrated loudness of the group track, as described with reference to FIGS. 1 and 2, requires a large amount of computation because the sound sources for the entire duration of the group track must be analyzed from the beginning.

Hereinafter, in calculating the group loudness, a method of calculating the loudness of the entire group track using loudness information on each track will be described.

Prediction of Loudness for Group Track Using Distribution of Short-Term Loudness for Each Track Integrated loudness and momentary loudness are defined in standards (ITU-R BS.1770-4, EBU R 128, EBU TECH 3341, EBU TECH 3342, or the like). Integrated loudness may be defined based on a momentary loudness histogram.

Figure 3:
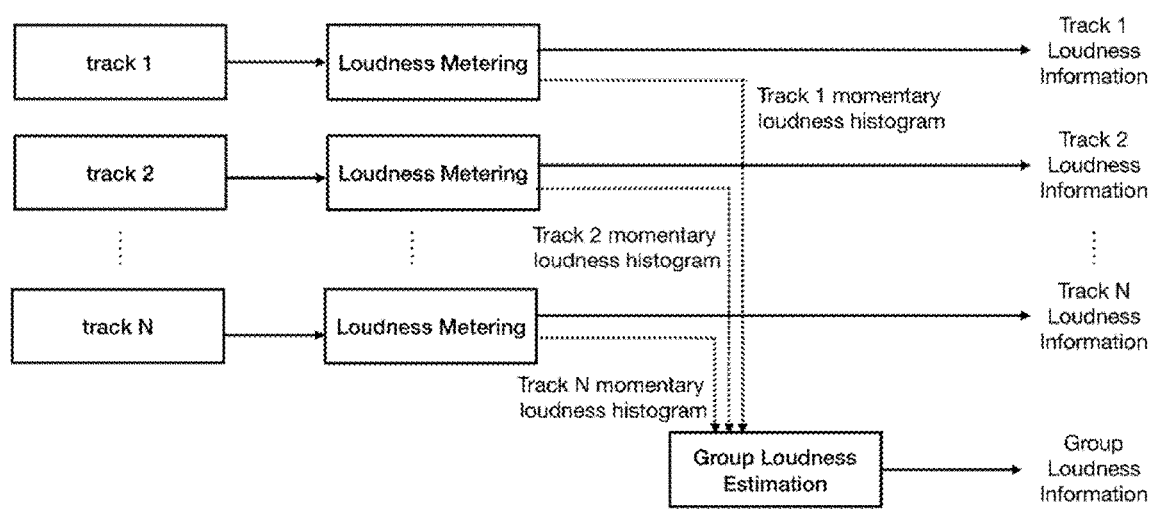
FIG. 3 is a diagram illustrating a method of predicting loudness for a group track according to an embodiment of the present disclosure.

FIG. 3 is a diagram illustrating a method of predicting loudness for a group track according to an embodiment of the present disclosure.

The loudness generation device may measure a loudness distribution for each of tracks constituting one piece of content (e.g., a group track). In addition, the loudness generation device may predict and generate loudness for one piece of content (e.g., a group track) by utilizing the measured loudness distribution for each track. In this case, the loudness distribution for each track may be a loudness distribution measured based on a time window having an arbitrary duration. As an example of the loudness distribution, there may be a short-term loudness distribution and a momentary loudness distribution, and in this case, the arbitrary duration may be 0.4 seconds and 3 seconds, respectively.

Referring to FIG. 3, the loudness generation device may measure short-term loudness distributions of the respective tracks constituting one piece of content (e.g., a group track). The loudness for one piece of content (e.g., a group track) may be predicted and generated by utilizing the measured short-term loudness distributions of the respective tracks. In this case, the short-term loudness distribution may be a momentary loudness histogram. The momentary loudness histogram may be obtained in the process of measuring the integrated loudness of each track.

Figure 4:
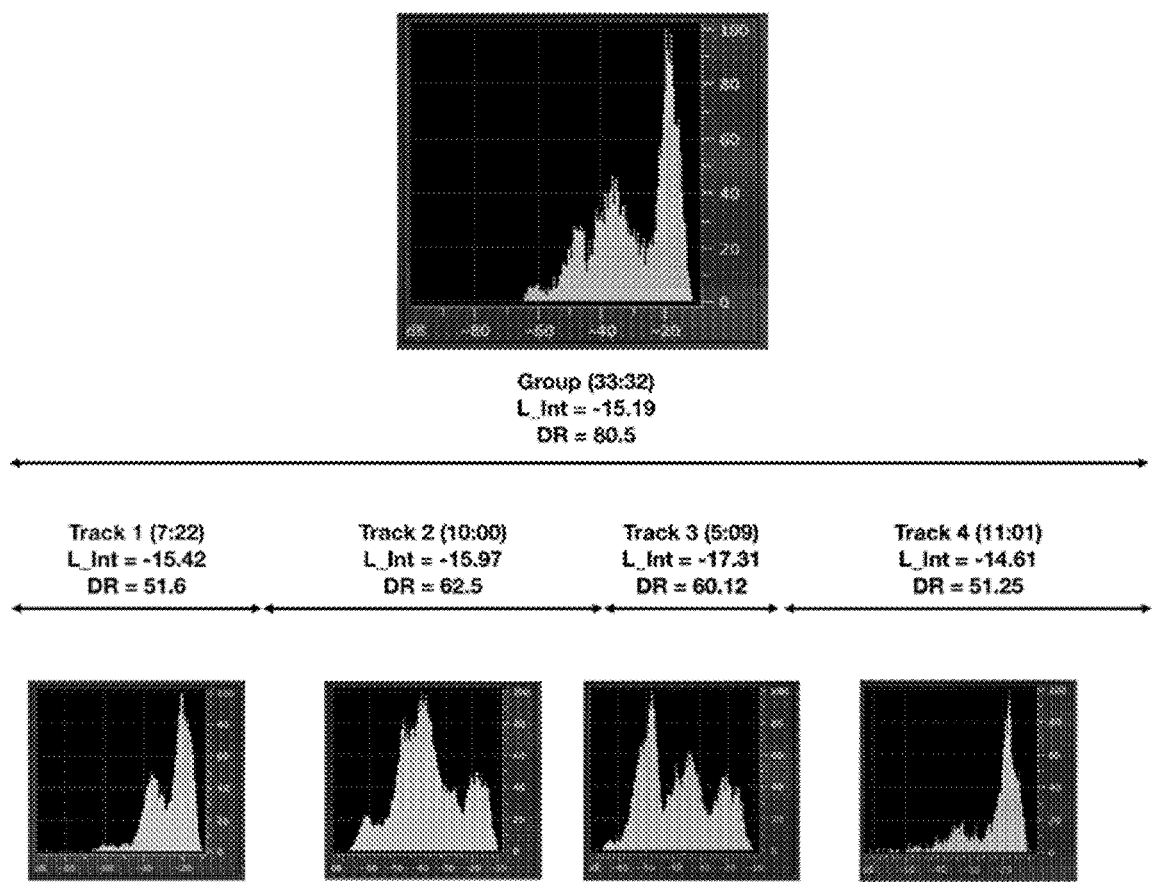
FIG. 4 is a diagram illustrating a histogram for a group track according to histograms for respective tracks according to an embodiment of the present disclosure.

FIG. 4 is a diagram illustrating a histogram for a group track according to histograms for respective tracks according to an embodiment of the present disclosure.

Referring to FIG. 4, one piece of content (e.g., a group track) may include four tracks (Track 1, Track 2, Track 3, and Track 4). For example, histograms of Track 1 to Track 4 are as follows. Track 1 is a sound source having a duration of 7 minutes and 22 seconds, integrated loudness L_Int of −15.42 LKFS, and a dynamic range DR of 51.6 LKFS. Track 2 is a sound source having a duration of 10 minutes, integrated loudness of −15.97 LKFS, and a dynamic range of 62.5 LKFS. Track 3 is a sound source having a duration of 10 minutes, integrated loudness of −17.31 LKFS, and a dynamic range of 60.12 LKFS. In addition, Track 4 is a sound source having a duration of 11 minutes and 1 second, integrated loudness of −14.61 LKFS, and a dynamic range of 51.25 LKFS.

In this case, the loudness generation device may measure momentary loudness histograms for each of the four tracks, and may predict a momentary loudness histogram for one piece of content (e.g., a group track) based thereon. That is, a histogram for one piece of content (e.g., a group track) may be predicted and generated based on momentary loudness histograms of the respective tracks constituting one piece of content. If a histogram for one piece of content (e.g., a group track) is generated, the integrated loudness for one piece of content (e.g., a group track) may be calculated using a method defined in a standard (ITU-R BS.1770-4 or the like).

The above-described histogram for one piece of content (e.g., a group track) is an example of the loudness distribution of one piece of content (e.g., a group track). In this case, the loudness distribution of one piece of content (e.g., a group track) may be a loudness distribution measured based on a time window having an arbitrary duration. As an example of the loudness distribution, there may be a short-term loudness distribution and a momentary loudness distribution, and in this case, the arbitrary duration may be 0.4 seconds and 3 seconds, respectively.

Although the description has been made based on the momentary loudness histograms for the respective tracks and the momentary loudness histogram for one piece of content (e.g., a group track) in FIGS. 3 and 4, this is only an example. The momentary loudness histogram for each track and the momentary loudness histogram for one piece of content (e.g., a group track) may be replaced by the distribution of the amplitude of a signal over time, such as a short-term loudness distribution, short-term root-mean-squares (RMS), or the like.

Measurement of Loudness for Group Track by Utilizing Integrated Loudness and Loudness Range (LRA) for Each Track The method of using the histograms described in FIGS. 3 and 4 requires information such as momentary loudness distributions for all of the tracks constituting one piece of content (e.g., a group track). However, such information may not be stored in some cases. Accordingly, hereinafter, a method of predicting and generating a loudness distribution for one piece of content (e.g., a group track) using information on each track will be described.

Figure 5:
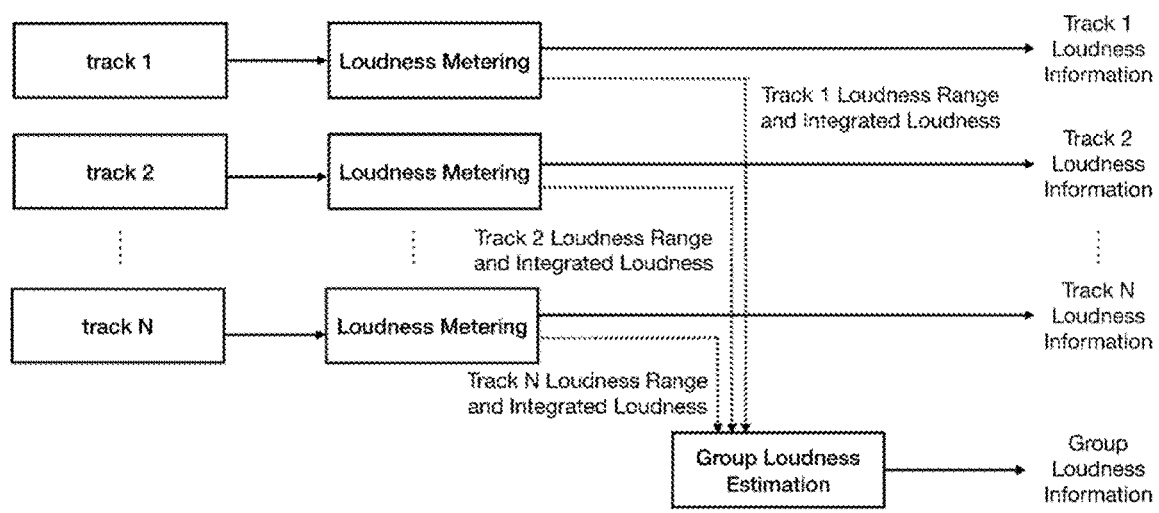
FIG. 5 is a diagram illustrating a method of predicting loudness for a group track according to an embodiment of the present disclosure.

FIG. 5 is a diagram illustrating a method of predicting loudness for a group track according to an embodiment of the present disclosure.

Referring to FIG. 5, one piece of content (e.g., a group track) may include N tracks (Track 1, Track 2, ..., and Track N). The loudness generation device may receive information on the respective tracks. The loudness generation device may receive integrated loudnesses $L\_1$, $L\_2$, ..., and $L\_N$ for the respective ones of the N tracks. The loudness generation device may receive information on a dynamic range indicating the degree of intensity of sound for each of the N tracks. Specifically, the loudness generation device may receive loudness ranges $LRA\_1$, $LRA\_2$, ..., and $LRA\_N$. The loudness generation device may receive durations $D\_1$, $D\_2$, ..., and $D\_N$ for the respective ones of the N tracks. In this case, the duration of each of the N tracks may be an exact time (e.g., the time in seconds), but is not limited thereto, and may be a relative duration between the N tracks.

The loudness generation device may predict a momentary loudness distribution for each of the N tracks using at least one of the received integrated loudness, loudness range, and duration of each of the N tracks. In this case, the momentary loudness distribution for each of the measured N tracks may be defined in the loudness range. For example, the momentary loudness distribution for each of the N tracks may be modelled by various methods. Specifically, the momentary loudness distribution for each of the N tracks may be defined as a white distribution centered on $L\_n$ and having a width of $LRA\_n$. This distribution may have a resolution of res LFKS. The momentary loudness distribution (dist_n[k]) for each of the N tracks may be defined as Equation 1 for k, which is a loudness index depending on a res interval. In Equation 1, "dist_n[k]" indicates the momentary loudness distribution of Track n, "D_n" is the duration of Track_n, and "LRA_n" is the loudness range of Track n.

$$\text{dist}\_n[k] = D\_n / LRA\_n/2)/\text{res} < k < (L\_n + LRA\_n/2)/\text{res}$$

for $(L\_n - LRA\_n/2)/\text{res} < k < (L\_n + LRA\_n/2)/\text{res}$ $$\text{dist}\_n[k] = 0, \quad \text{[Equation 8]}$$

otherwise

The loudness generation device may predict a momentary loudness distribution for one piece of content (e.g., a group track) by summing all of the momentary loudness distributions for respective ones of the N tracks, which are predicted using Equation 1. At this time, the momentary loudness distribution (dist_group[k]) for one piece of content (e.g., a group track) may be calculated as shown in Equation 2.

$$\text{dist\_group}[k] = \text{sum}\_\{\text{from } n=1 \text{ to } N\}(\text{dist}\_n[k]) \quad \text{[Equation 2]}$$

The loudness generation device may generate an integrated loudness for one piece of content (e.g., a group track) on the basis of the momentary loudness distribution for one piece of content (e.g., a group track) predicted using Equation 2. Here, the integrated loudness for one piece of content (e.g., a group track) may be calculated by a method defined in a standard (ITU-R BS.1770-4 or the like).

Figure 6:
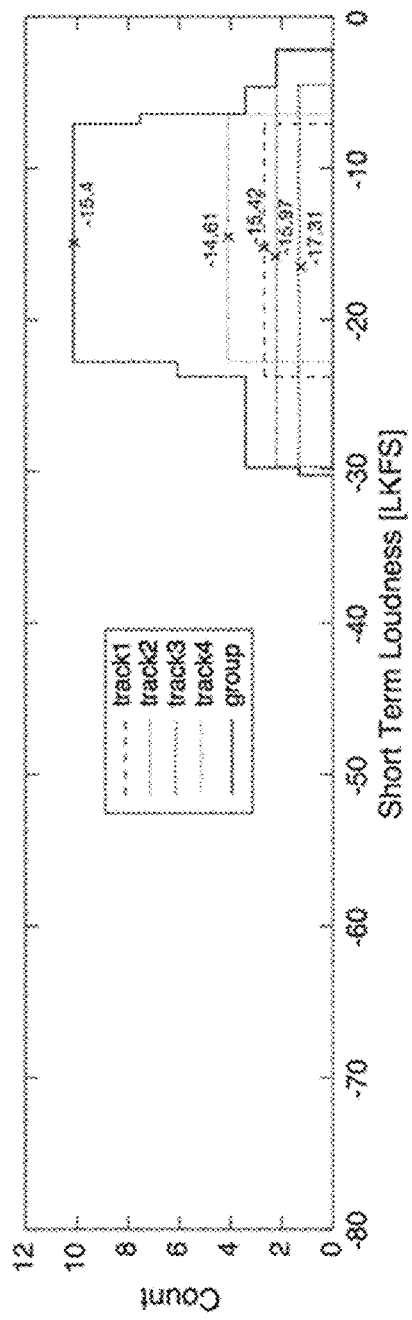
FIG. 6 is a diagram illustrating the results of measuring loudness for a group track according to an embodiment of the present disclosure.

FIG. 6 is a diagram illustrating the results of measuring loudness for a group track according to an embodiment of the present disclosure.

Specifically, FIG. 6 is a diagram illustrating a measurement value of integrated loudness for one piece of content (e.g., a group track) generated based on the momentary loudness distribution of the one piece of content (e.g., a group track) calculated using Equation 2.

Referring to FIG. 6, one piece of content may include a total of 4 tracks (Track 1 to Track 4). In this case, the loudness generation device may predict a momentary loudness distribution for the one piece of content (e.g., a group track) by modelling integrated loudness (−15.42, −15.97, −17.31, and −14.61 LKFS), loudness ranges (16.6, 27.5, 25.2, and 16.3 LKFS), and track durations (442, 600, 309, and 661 seconds) for the respective tracks, which correspond to the tracks (Track 1 to Track 4), respectively, using res=0.1 LKFS. In addition, the loudness generation device may predict the integrated loudness for one piece of content (e.g., a group track) as −15.4 LKFS on the basis of the predicted momentary loudness distribution for one piece of content (e.g., a group track).

In other words, the loudness generation device may predict a momentary loudness distribution for each track by modelling the integrated loudness, loudness range, and track duration for each track, which correspond to each track. The loudness generation device may predict a momentary loudness distribution for one piece of content (e.g., a group track) on the basis of the measured momentary loudness distribution for each track. The loudness generation device may predict and generate an integrated loudness for one piece of content (e.g., a group track) on the basis of the momentary loudness distribution for the one piece of content (e.g., a group track).

When one piece of content (e.g., a group track) is output (or reproduced), metadata related to the integrated loudness of the one piece of content (e.g., a group track) may be used.

In addition, loudness normalization may be performed based on the integrated loudness for the one piece of content (e.g., a group track).

In other words, the integrated loudness for one piece of content (e.g., a group track) may be predicted from a loudness distribution (an intermediate loudness distribution), which is a distribution for one piece of content (e.g., a group track). In this case, the intermediate loudness distribution may be generated based on information on each track (the integrated loudness for each track, the loudness range for each track, the duration for each track, and the like). Specifically, the intermediate loudness distribution may be generated from the loudness distribution, which is generated based on the information on each track. In this case, the loudness distribution and the intermediate loudness distribution, which are generated based on the information on each track, as described above, may indicate the loudness distribution measured based on a time window having an arbitrary duration, that is, the distribution of the amplitude of a signal over time. For example, it may be a short-term loudness distribution, a momentary loudness distribution, an RMS, or a histogram.

Figure 7:
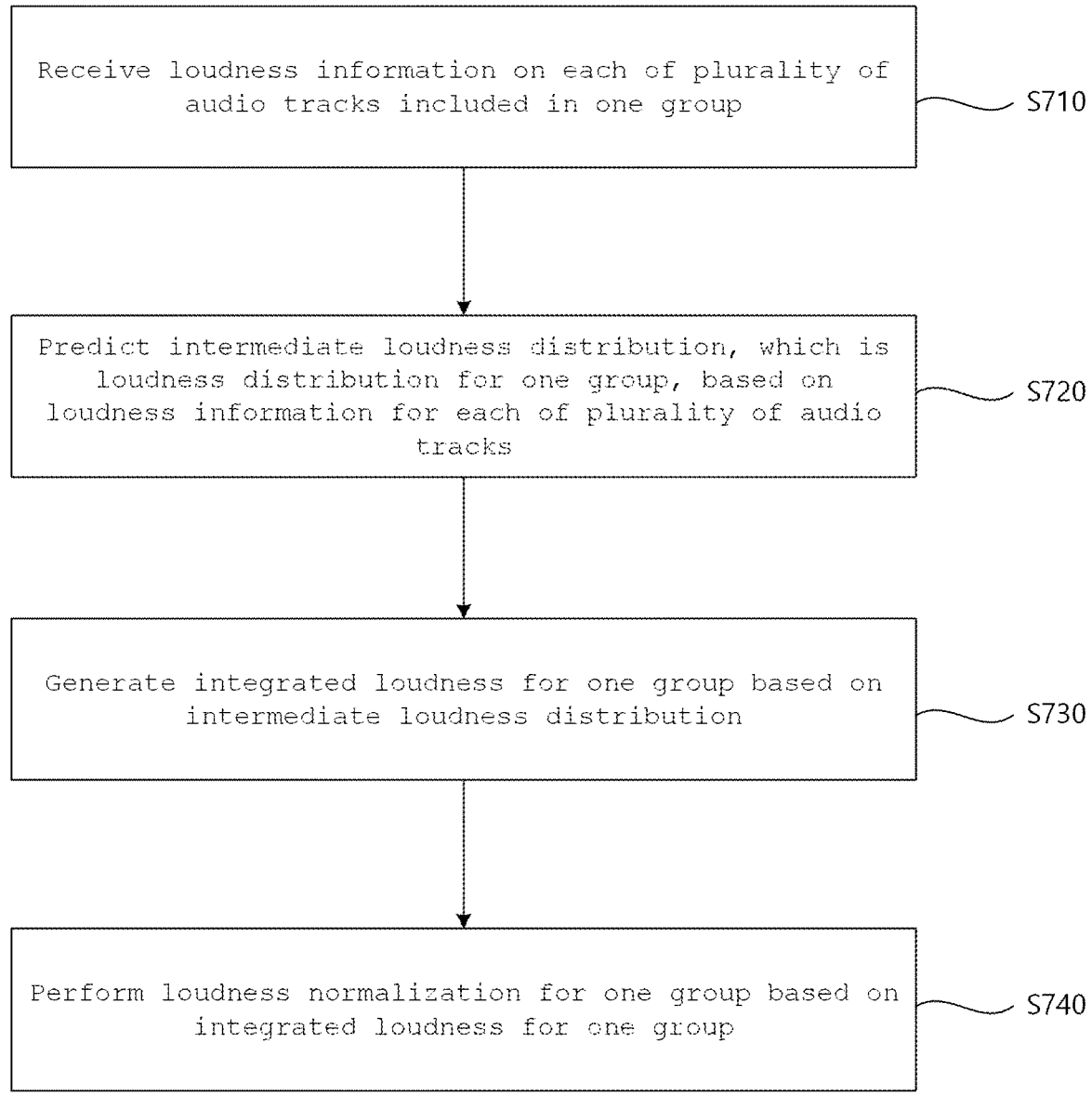
FIG. 7 is a flowchart for generating loudness for a group track according to an embodiment of the present disclosure.

FIG. 7 is a flowchart for generating loudness for a group track according to an embodiment of the present disclosure.

An audio loudness generation device may be configured to include an input terminal for receiving loudness information on each of a plurality of audio tracks included in one group. In addition, the audio loudness generation device may be configured to include a processor for performing a method of predicting and generating an integrated loudness for one group. The audio loudness generation device may be the same as the loudness generation device described above, and the one group may be the same as one piece of content (e.g., a group track) described above.

A method in which the audio loudness generation device predicts and generates integrated loudness for one piece of content (e.g., a group track) on the basis of the above-described method will be described with reference to FIG. 7.

The audio loudness generation device may receive loudness information on each of a plurality of audio tracks included in one group (S710). In this case, the loudness information on each of the plurality of audio tracks may include at least one of an integrated loudness, a loudness range, and a duration of each of the plurality of audio tracks. The duration of each of the plurality of audio tracks may be a relative duration.

The audio loudness generation device may predict an intermediate loudness distribution, which is a loudness distribution for the one group, on the basis of the loudness information for each of the plurality of audio tracks (S720).

The audio loudness generation device may generate an integrated loudness for the one group on the basis of the intermediate loudness distribution (S730).

The audio loudness generation device may generate an integrated loudness for the one group on the basis of the momentary loudness distribution for the one group (S740).

The intermediate loudness distribution may be predicted based on the loudness distribution for each of the plurality of audio tracks, and the loudness distribution for each of the plurality of audio tracks may be generated based on the loudness information on each of the plurality of audio tracks.

The loudness distribution for each of the plurality of audio tracks may be a histogram. In addition, the intermediate loudness distribution may be a histogram.

The intermediate loudness distribution may be predicted by summing all of the loudness distributions for the respective audio tracks, and Equation 2 may be used in doing so.

The loudness distribution for each of the plurality of audio tracks may be generated using Equation 1 above.

The loudness distribution for each of the plurality of audio tracks may be a loudness distribution measured in a predetermined time period. In addition, the intermediate loudness distribution may be a loudness distribution measured in a predetermined time period. As described above, the loudness distribution for each of the plurality of audio tracks or the intermediate loudness distribution may be a loudness distribution measured based on a time window having an arbitrary duration. For example, it may be a short-term loudness distribution, a momentary loudness distribution, or the like.

The embodiments of the present disclosure described above can be implemented through various means. For example, embodiments of the present disclosure may be implemented by hardware, firmware, software, a combination thereof, and the like.

In the case of implementation by hardware, a method according to embodiments of the present disclosure may be implemented by one or more of application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, and the like.

In the case of implementation by firmware or software, a method according to the embodiments of the present disclosure may be implemented in the form of a module, a procedure, a function, and the like that performs the functions or operations described above. Software code may be stored in a memory and be executed by a processor. The memory may be located inside or outside the processor, and may exchange data with the processor through various commonly known means.

Some embodiments may also be implemented in the form of a recording medium including computer-executable instructions, such as a program module executed by a computer. Such a computer-readable medium may be a predetermined available medium accessible by a computer, and may include all volatile and nonvolatile media and removable and non-removable media. Further, the computer-readable medium may include a computer storage medium and a communication medium. The computer storage medium includes all volatile and non-volatile media and removable and non-removable media, which have been implemented by a predetermined method or technology, for storing information such as computer-readable instructions, data structures, program modules, and other data. The communication medium typically include a computer-readable command, a data structure, a program module, other data of a modulated data signal, or another transmission mechanism, as well as predetermined information transmission media.

The present disclosure has been made for illustrative purposes, and a person skilled in the art to which the present disclosure pertains will be able to understand that the present disclosure can be easily modified into other specific forms without changing the technical spirit or essential features of the present disclosure. Therefore, it should be understood that the embodiments described above are not intended to limit the scope of the present disclosure. For example, each element described as a single type may be implemented in a distributed manner, and similarly, elements described as being distributed may also be implemented in a combined form.

The invention claimed is:

1. A method of generating audio loudness metadata performed by an audio loudness metadata generation device, the method comprising:
   receiving loudness information on each of a plurality of audio tracks included in one group;
   predicting an intermediate loudness distribution, which is a loudness distribution for the one group, on the basis of loudness information on each of the plurality of audio tracks; and
   generating an integrated loudness for the one group on the basis of the intermediate loudness distribution,
   wherein the loudness information on each of the plurality of audio tracks includes an integrated loudness, a loudness range, and a duration for each of the plurality of audio tracks.

2. The method of claim 1, further comprising performing loudness normalization for the one group on the basis of the integrated loudness for the one group.

3. The method of claim 1, wherein the intermediate loudness distribution is predicted based on the loudness distribution for each of the plurality of audio tracks, and
   wherein the loudness distribution for each of the plurality of audio tracks is generated based on the loudness information on each of the plurality of audio tracks.

4. The method of claim 3, wherein the loudness distribution for each of the plurality of audio tracks is a histogram.

5. The method of claim 4, wherein the intermediate loudness distribution is a histogram.

6. The method of claim 1, wherein the duration of each of the plurality of audio tracks is a relative duration.

7. The method of claim 3, wherein the intermediate loudness distribution is predicted by summing all of the loudness distributions for the respective audio tracks.

8. The method of claim 3, wherein the loudness distribution for each of the plurality of audio tracks is generated through an equation, $$\text{dist}\_n[k] = D\_n / LRA\_n / \text{res}$$

for $(L\_n - LRA\_n/2)/\text{res} < k < (L\_n + LRA\_n/2)/\text{res}$ $$\text{dist}\_n[k] = 0,$$

otherwise where, "D_n" is a duration of an $n^{th}$ track among the plurality of audio tracks, "LRA_n" is a loudness range of the $n^{th}$ track among the plurality of audio tracks, "L_n" is an integrated loudness of the $n^{th}$ track among the plurality of audio tracks, "res" is a momentary loudness resolution of the $n^{th}$ track among the plurality of audio tracks, "dist_n[k]" is an intermediate loudness distribution of the $n^{th}$ track among the plurality of audio tracks, and "k" is a loudness index according to a res interval.

9. The method of claim 3, wherein the loudness distribution for each of the plurality of audio tracks is a loudness distribution measured in a predetermined time period.

10. An audio loudness metadata generation device for performing a method of generating audio loudness metadata, the audio loudness metadata generation device comprising:
    an input terminal configured to receive loudness information on each of a plurality of audio tracks included in one group; and
    a processor,
    wherein the processor is configured to:
    predict an intermediate loudness distribution, which is a loudness distribution for the one group, on the basis of loudness information on each of the plurality of audio tracks, and generate an integrated loudness for the one group on the basis of the intermediate loudness distribution, wherein the loudness information on each of the plurality of audio tracks includes an integrated loudness, a loudness range, and a duration for each of the plurality of audio tracks.

11. The device of claim 10, wherein the processor is configured to perform loudness normalization for the one group on the basis of the integrated loudness for the one group.

12. The device of claim 10, wherein the intermediate loudness distribution is predicted based on the loudness distribution for each of the plurality of audio tracks, and wherein the loudness distribution for each of the plurality of audio tracks is generated based on the loudness information on each of the plurality of audio tracks.

13. The device of claim 12, wherein the loudness distribution for each of the plurality of audio tracks is a histogram.

14. The device of claim 13, wherein the intermediate loudness distribution is a histogram.

15. The device of claim 10, wherein the duration of each of the plurality of audio tracks is a relative duration.

16. The device of claim 12, wherein the intermediate loudness distribution is predicted by summing all of the loudness distributions for the respective audio tracks.

17. The device of claim 12, wherein the loudness distribution for each of the plurality of audio tracks is generated through an equation, $$\text{dist}\_n[k] = D\_n/LRA\_n/2)/\text{res} < k < (L\_n + LRA\_n/2)/\text{res}$$

for $(L\_n - LRA\_n/2)/\text{res} < k < (L\_n + LRA\_n/2)/\text{res}$ $$\text{dist}\_n[k] = 0,$$

otherwise where, "D_n" is a duration of an $n^{th}$ track among the plurality of audio tracks, "LRA_n" is a loudness range of the $n^{th}$ track among the plurality of audio tracks, "L_n" is an integrated loudness of the $n^{th}$ track among the plurality of audio tracks, "res" is a momentary loudness resolution of the $n^{th}$ track among the plurality of audio tracks, "dist_n[k]" is an intermediate loudness distribution of the $n^{th}$ track among the plurality of audio tracks, and "k" is a loudness index according to a res interval.

18. The device of claim 12, wherein the loudness distribution for each of the plurality of audio tracks is a loudness distribution measured in a predetermined time period.

\* \* \* \* \*